ULTRAHIGH FREQUENCY TUNER

Filed Sept. 21, 1951 4 Sheets-Sheet 1

Inventor:
Harry C. Rowe
By Wilberg, Knipper & Gradolph
Attys.

ULTRAHIGH FREQUENCY TUNER

Filed Sept. 21, 1951 4 Sheets-Sheet 2

Inventor:
Harry C. Rowe
By Ahlberg, Wupper & Gradolph
Attys.

Nov. 13, 1956

H. C. ROWE 2,770,723

ULTRAHIGH FREQUENCY TUNER

Filed Sept. 21, 1951

4 Sheets-Sheet 3

Inventor:
Harry C. Rowe
By Ahlberg, Wupper & Gradolph
Attys.

Inventor:
Harry C. Rowe
By Ahlberg, Wupper & Gradolph
Attys.

United States Patent Office 2,770,723

Patented Nov. 13, 1956

2,770,723

ULTRAHIGH FREQUENCY TUNER

Harry C. Rowe, Cincinnati, Ohio, assignor to Stewart-Warner Corporation, Chicago, Ill., a corporation of Virginia Application September 21, 1951, Serial No. 247,627

10 Claims. (Cl. 250—20)

This invention relates generally to radio apparatus for ultra high frequencies, and particularly to tunable devices such as oscillators, amplifiers, and modulators. The invention is especially applicable to combinations of tunable devices. One such combination is the tuner section of a superheterodyne radio receiver. The tuner of such a receiver may include radio frequency amplifiers, a high frequency oscillator, and a mixer or modulator, all of which are tuned concurrently.

An object of the invention is to provide a superheterodyne tuner for continuously covering an extremely wide frequency band at extremes high frequencies. For example, an object is to cover the frequency band from approximately 500 megacycles to approximately 1000 megacycles in one continuous range. This particular frequency band is very useful for such radio services as television. Covering a wide band in one continuous range eliminates many complications such as band switching.

A further object is to provide an oscillator providing useful fundamental output in the neighborhood of 1000 megacycles. Such an oscillator is extremely valuable as the high frequency oscillator of a superheterodyne tuner. Utilizing the fundamental output of an oscillator rather than its harmonic output avoids many difficulties, such as the spurious reception of signals at points in a tuning range other than the single correct point.

A further object is to provide an ultra high frequency tuner in which satisfactory tracking between the high frequency oscillator and the radio frequency tuning circuits is easily obtained without resorting to a complicated mechanical drive. Tracking involves a tuning scheme for maintaining a fixed frequency difference between the operating frequencies of the high frequency oscillator and the radio frequency circuits of a superheterodyne tuner.

A further object is to provide a tuning arrangement providing a considerable amount of band spread to avoid critical and difficult tuning. Band spread involves an arrangement in which a movable tuning member must be moved over a considerable distance to traverse a frequency band.

A further object is to provide an ultra high frequency tuner which is extremely small and compact. Miniaturization and even sub-miniaturization of apparatus is extremely important in the military field.

A further object is to provide an efficient improved tuner utilizing tubes which are readily available and relatively economical.

A further object is to provide a tuner which may be manufactured easily and economically.

Further objects, advantages and features of the invention will become apparent from the following description of illustrative embodiments. In the course of the description, reference will be made to the drawings in which.

Figure 1:
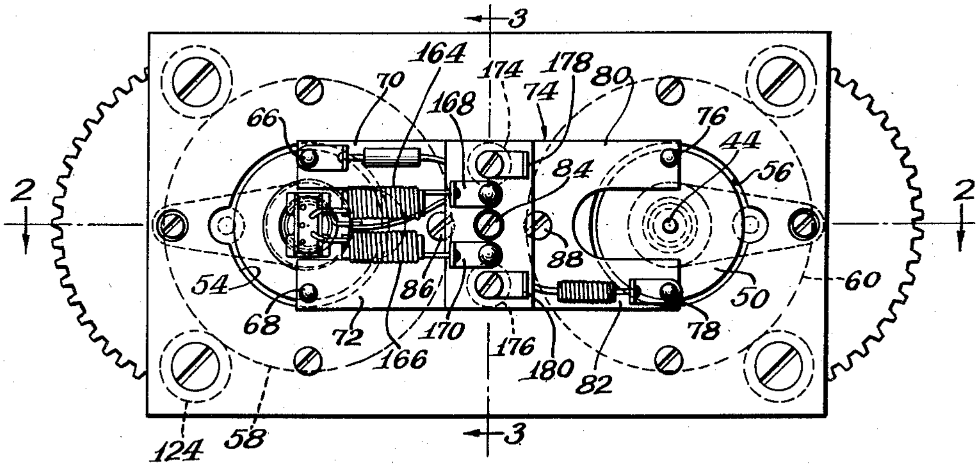
Fig. 1 is an elevational view of an ultra high frequency tuner constructed in accordance with the invention.

The tuner shown in Figs. 1–5 includes an oscillator section 20 and a mixer section 22. The oscillator section includes a triode tube 24 having a cylindrical plate terminal 26 at one end and a cylindrical cathode terminal 28 at the other end. A pair of tubular glass sections 30 and 32 connect the plate and cathode cylinders with a central disc-shaped grid terminal 34. The tube 24 may be the RCA type 5675.

The oscillator section includes a crystal rectifier 40 having end terminals 42 and 44 in the form of metallic pins. The front terminal 42 is tightly fitted or soldered into an apertured internal flange 46 inside an elongated cylinder 48 having the same outside diameter as the plate terminal cylinder 26 of the tube 24. The rear terminal pin 44 of the crystal rectifier 40 is soldered into an apertured disc 50 having approximately the same diameter as the grid disc 34 of the tube 24.

The tube 24 and the crystal rectifier 40 are supported on a rear base plate 52 with the plate cylinder 26 of the tube and the sleeve 48 parallel. The grid disc 34 and the disc 50 are positioned in generally circular oversized openings 54 and 56 extending through the insulating base plate 52. The front ends of the holes 54 and 56 are partly closed by a pair of metallic coupling plates 58 and 60 secured to the front side of the base plate 52. Thin sheets 62 and 64 of a dielectric material are positioned in back of the plates 58 and 60 to insulate the plates from the grid disc 34 and the crystal terminal disc 50, respectively.

The grid disc 34, the thin circular plate 58 and the dielectric film 62 form a grid blocking capacitor for the oscillator section 20.

The coupling plate 60, the crystal terminal disc 50 and the thin insulating sheet 64 form a blocking capacitor in the mixer circuit 22.

The grid disc 34 is pressed lightly against the insulating sheet 62 by a pair of diametrically positioned metallic studs 66 and 68 (Fig. 4) carried by a pair of parallel arms 70 and 72 of a flexible insulating spider 74. The crystal terminal disc 50 is lightly pressed against the insulating sheet 64 by a pair of studs 76 and 78 carried by arms 80 and 82 which extend in a direction opposite the arms 70 and 72 on the spider 74.

Figure 2:
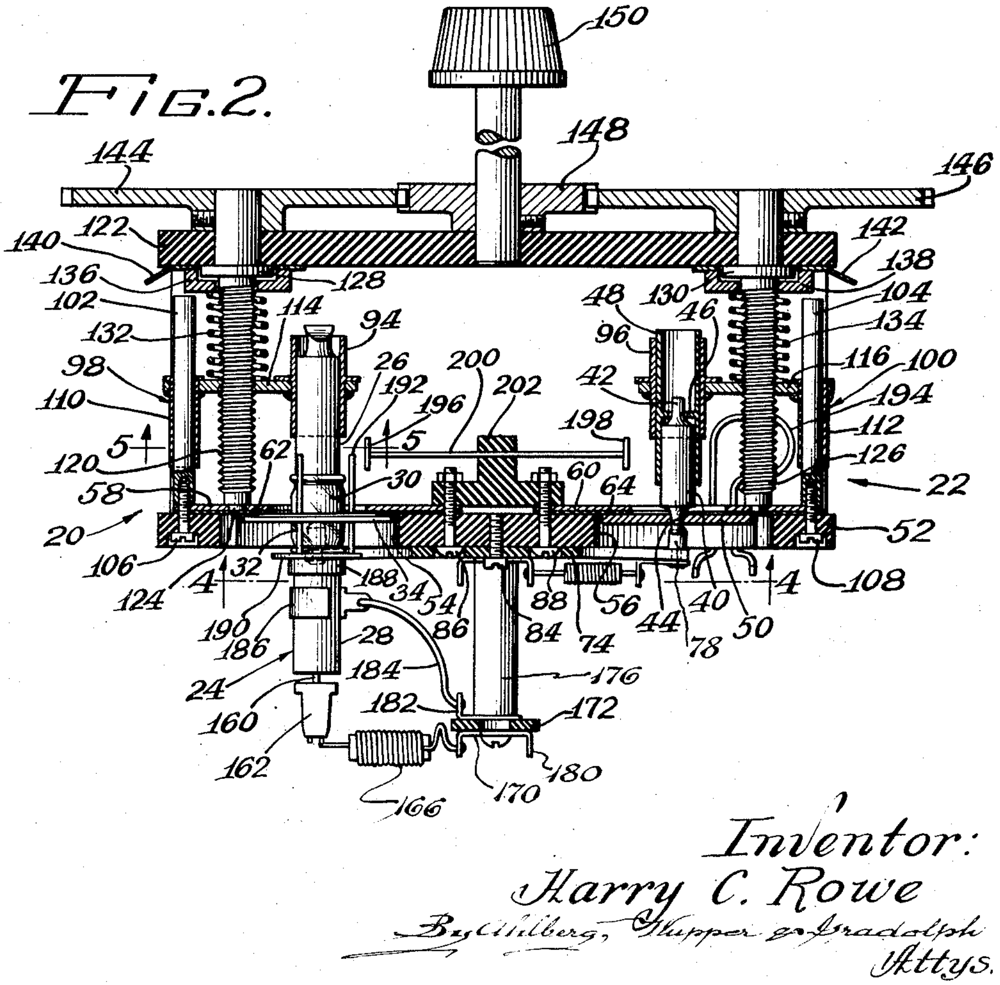
Fig. 2 is a sectional plan view of the tuner taken as indicated by the line 2—2 of Fig. 1.
Figure 3:
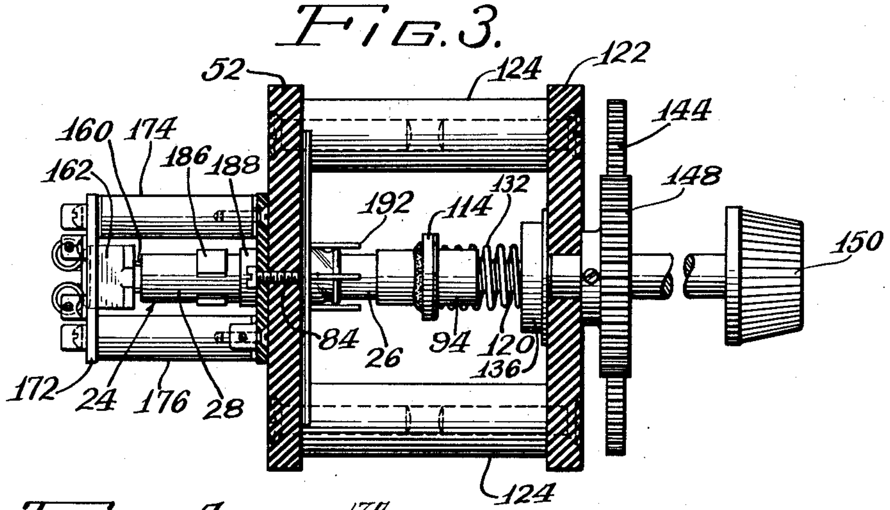
Fig. 3 is a sectional side elevational view of the tuner taken as indicated by the line 3—3 in Fig. 1.

The spider is held in place by a single machine screw 84 threaded into the base plate 52. The spider is held in alignment with the tubes 24 and the crystal rectifier 40 by a pair of machine screws 86 and 88 which register with apertures 90 and 92 in the spider. The machine screws 86 and 88 also serve to mount the coupling plates 58 and 60 on the base plate 52. When the machine screw 84 is tightened down the spider 74 flexes slightly as shown in Fig. 2 to produce slight pressures on the grid disc 34 and the crystal disc 50.

A pair of sleeves 94 and 96 are slidably carried on the plate cylinder 26 and the crystal cylinder 48. The sleeves 94 and 96 form parts of a pair of tuning circuits 98 and 100 which also include a pair of posts 102 and 104 which extend parallel with the plate cylinder 26 and the crystal 48 respectively. The posts are mounted on the base plate 52 by means of machine screws 106 and 108. The rear ends of the posts are thereby clamped into electrical contact with the front surface of the coupling plates 62 and 64.

A pair of elongated sleeves 110 and 112 are slidably carried by the posts 102 and 104. The sleeves 110 and 94 are joined together by a cross bar 114 and the sleeves 96 and 112 by a cross bar 116.

The sleeve 94, the cross bar 114, the sleeve 110, the post 102 and the coupling plate 58 are included in the tuning circuit 98 which provides coupling between the plate cylinder 26 and the grid disc 34 of the tube 24. The tuning circuit 100, which couples the crystal cylinder 48 with the crystal terminal disc 50, includes the sleeve 96, the cross bar 116, the sleeve 112, the post 104 and the coupling plate 60.

An insulating drive screw 120 is threaded through the cross bar 114 to provide means for sliding the sleeves 94 and 110 back and forth on the plate cylinder 26 and the post 102. The screw 120 is rotatably carried by an insulating front base plate 122 connected with the rear base plate 52 by means of four insulating pillars 124. The rear end of the screw 120 has a nose portion 124 having a reduced diameter to fit snugly into a bearing aperture in the coupling plate 58.

A similar insulating screw 126 is threaded through the cross bar 116 to provide means for sliding the sleeves 96 and 112 back and forth. The screws 120 and 126 have flanges 128 and 130 adjacent their front ends which abut against the front base plate 122 to limit endwise movement of the screws.

A pair of coiled compression springs 132 and 134 are positioned around the screw 120 and 126 respectively between the cross bars 114 and 116 and a pair of conductive collars 136 and 138 positioned adjacent the front base plate 122. A pair of terminal washers 140 and 142 are positioned between the front base plate 122 and the collars 136 and 138. The springs 132 and 134, the collars 136 and 138, and the terminals 140 and 142 provide means for making electrical contact with the cross bars 114 and 116. The springs 132 and 134 also take up any endwise play in the drive including the screws 120 and 126.

The screws 120 and 126 may be rotated simultaneously by means of a drive including gears 144 and 146 mounted on the front ends of the screws 120 and 126. The gears mesh with a pinion 148 which may be rotated manually by means of a tuning knob 150.

The studs 66 and 78 provide means for making electrical contact with the grid disc 34 and the crystal disc 50 respectively. A resistor 152 and a choke 154 may be connected between the studs and a pair of terminal lugs 156 and 158.

The heater connections for the tube 24 are brought out by means of pins 160. A socket 162 may be provided to make contact with the heater pins 160. Heater current may be supplied to the socket by means of a pair of heater chokes 164 and 166 which are connected between the socket 162 and a pair of terminal lugs 168 and 170 mounted on a terminal strip 172 which is supported on the spider 74 by means of a pair of metallic pillars 174 and 176. The pillars provide electrical connections between the terminal lugs 156 and 158 and a pair of terminal lugs 178 and 180 carried on the rear side of the terminal strip 172. The pillar 174 also makes contact with a lug 182 which is connected by means of a conductor 184 to a clip 186 carried on the cathode cylinder 28 of the tube 24. Thus, the grid disc 34 of the tube 24 is connected with the cathode cylinder 28 by means of the stud 66, the resistor 152, the pillar 174, the conductor 184, and the contacting clip 186.

A collar 188 is snugly carried on the cathode cylinder 28 above the contacting clip 186. The collar has a flange 190 which carries a plurality of wires 192 which extend generally parallel with the tube 24 through clearance holes 193 in the grid disc 34. The front ends of the wires 192 are positioned adjacent the rear end of the plate cylinder 26. The assembly including the collar 188, the flange 190 and the wires 192 provides supplementary capacitance between the plates 26 and the cathode 28.

A coupling loop 194 having a single turn is mounted on the rear base plate 52 adjacent the tuning circuit 100 in order to provide means for impressing an input signal upon the mixer section 22.

Supplementary coupling between the mixer section 22 and the oscillator section 20 is provided by means of plates 196 and 198 which are positioned adjacent the plate cylinder 26 and the crystal cylinder 48 respectively. The plates are connected together by means of a rigid conductor 200 which is mounted on the rear base plate 52 by means of an insulating bracket 202.

*Operation of the apparatus of Figs. 1–5*

To put the tuner into operation, plate voltage is applied between the lug 140 and the cathode terminal 178. The plate current is conducted to the cylindrical anode terminal 26 through the coil spring 132. Heater voltage is applied between the terminals 168 and 170. The resistor 152 provides grid bias for the tube 24. Input signals from an antenna or a radio frequency amplifier stage may be applied to the coupling loop 194. The output of the tuner may be taken between the terminal 180 and the lug 142. The terminal 180 is connected to one side of the crystal 40 through the choke 154, and the lug 142 is connected to the other side of the crystal through the coil spring 134.

Feedback to produce oscillation in the oscillator section 20 is provided by the tuning circuit 98, which couples the plate cylinder 26 of the tube 24 with the grid disc 34. The grid disc 34, the coupling plate 58 and the dielectric film 62 form a grid blocking capacitor connecting one end of the tuning inductance 98 with the grid of the tube 24.

The tuning circuit 98 has a relatively large value of inductive reactance at the resonant frequency. The main resonant circuit capacitance is that of the internal capacitance between the plate and the grid of the tube 24.

The conductors 192 provide supplementary capacitance between the cathode and the plate of the tube 24. The supplementary capacitance is extremely important for promoting oscillation in the oscillator section 20. The supplementary capacitance provides a proper relationship between the plate-to-cathode and the grid-to-cathode voltages in the oscillator section, both as to phasing and magnitude. The tube 24 has a relatively low plate-to-cathode capacitance with respect to its grid-to-cathode capacitance. The additional plate-to-cathode capacitance, provided by the conductors 192, improves the division of high frequency voltages between the plate-to-grid path and the grid-to-cathode path of the tube 24.

Signals impressed upon the coupling loop 194 are transmitted inductively to the tuning circuit 100 of the mixer section 22. The tuning circuit impresses the signals between the terminals of the crystal rectifier 40.

The crystal terminal disc 50, the coupling plate 60, and the dielectric film 64 provide a blocking capacitor to avoid shortcircuiting the crystal rectifier 40. The tuning circuit 100, which is largely inductive, is resonated by its own distributed capacitance, the capacitance between the crystal terminal disc 50 and the crystal cylinder 48, and the internal capacitance between the terminals of the crystal 40.

The close proximity of the oscillator section 20 and the mixer section 22 provides inductive and capacitive coupling to transmit signals from the oscillator section 20 to the mixer section 22. The plates 196 and 198 provide supplementary capacitive coupling between the oscillator section 20 and the mixer section 22.

The operating frequency of the oscillator section 20 may be varied by shifting the position of the slide bar 114 and the sleeves 94 and 110 carried by the bar. The primary effect of moving the sleeves 94 and 110 along the plate cylinder 26 and the post 102 is to change the inductance of the tuning circuit 98, although the distributed capacitance of the tuning circuit is also changed to a certain extent. Moving the slide bar 114 inwardly reduces the physical length and the inductance of the tuning circuit 98, and thereby raises the operating frequency of the oscillator 20.

The resonant frequency of the mixer tuning circuit 100 is changed by shifting the sleeves 96 and 112 along the terminal cylinder 48 and the post 104. Since the oscillator section 20 and mixer section 22 are tuned by a straight line sliding movement, the arrangement to provide ganged tuning of the oscillator and the mixer is quite simple. The oscillator 20 and the mixer 22 are tuned simultaneously by turning the knob 150. The knob is geared to the oscillator and mixer drive screws 120 and 126, which are threaded through the slide bars 114 and 116.

The operating frequencies of the oscillator 20 and the mixer 22 are variable from about 500 megacycles to about 1000 megacycles. Of course the oscillator and the mixer are tuned to frequencies which differ by some constant intermediate frequency. However, the frequency difference is quite small, since the intermediate frequency is only a small fraction of the operating frequency of the mixer section 22. The difference in the operating frequencies of the tuning circuits 98 and 100 may be adjusted merely by shifting one of the drive screws 120 or 126 with respect to its driving gear 144 or 146.

Inasmuch as the oscillator operates at the fundamental frequency and the intermediate frequency is small compared to the operating frequency, the tuning circuits 98 and 100 are substantially alike. Hence, the problem of tracking these two circuits to operate at the constant difference of the intermediate frequency by mechanical deviation means is much more simple. The crystal terminal cylinder 48 and the crystal terminal disc 50 provide an arrangement which corresponds closely with the physical configuration of the oscillator tube 24.

The tuning circuits 98 and 100 provide low inductance values to resonate in the range from 500 to 1000 megacycles. Nevertheless the circuits 98 and 100 have exceptionally low losses and high factors of merit. Operation of the oscillator 20 in the neighborhood of 1000 megacycles is possible only because of the low loss construction of the tuning circuit 98. Arranging the sleeve 94 to slide directly on the anode terminal cylinder 26 provides a minimum of losses from such factors as contact resistance and dielectric losses in insulating supports.

The construction of the tuned circuits 98 and 100 is such that losses from contact resistance are negligible. The coupling between the sleeves 94, 110, 96 and 112 and the cylinders 26, 102, 48 and 104 is largely capacitive rather than conductive. Each of the sleeves is so long that the capacitive reactance between the sleeve and its cylinder is much smaller than the contact resistance between the sleeve and the cylinder. The provision of the capacitive coupling in shunt with the sliding contacts eliminates any substantial possibility of noisy operation due to contact imperfections. Furthermore, by virtue of the capacitive coupling the sleeves may be fitted freely on the cylinders so that the sleeves may be shifted smoothly without binding. A free sliding fit between the sleeve 94 and the anode cylinder 26 is particularly important because excessive friction between these parts might damage the glass portions 30 and 32 of the tube 24.

The tube 24 and the crystal 40 are mounted in such a way that they may shift laterally as the sleeves 94 and 96 are moved along the cylinders 26 and 48. This mounting arrangement prevents binding between the sleeves and the cylinders. Such binding might damage the tube 24 or the crystal 40. The holes 54 and 56 in which the grid disc 34 and the crystal disc 50 are positioned are oversized to permit lateral movement of the discs. The discs are held in place only by light pressure applied by the spider 74. The leads which make electrical connection with the tube 24 have sufficient excess length to permit lateral shifting of the tube.

Utilizing the anode terminal cylinder 26 as a support for the slidable sleeve 94 provides a particularly compact and economical tuning circuit having a minimum number of parts. This constructional feature is largely responsible for the subminiature proportions of the tuner.

The coil springs 132 and 134 take up any slack between the drive screws 120 and 126 and the slide bars 114 and 116. The coil springs also serve as high frequency choke coils to make electrical connections to the slide bars without interfering with the operation of the oscillator 20 or the mixer 22. The springs 132 and 134 are wound with enough turns to function efficiently as choke coils. As the oscillator and the mixer are tuned, the length and the inductance of the springs change, the length becoming greater and the inductance smaller as the operating frequency of the tuner increases, and vice versa. This variation in the length of the springs automatically changes the inductance of the springs as the operating frequency of the tuner changes, so that the inductance is maintained approximately at an optimum value.

The tuning circuits 98 and 100 provide a considerable amount of bandspread. This arises from the fact that the slide bars 114 and 116 are moved a considerable distance as the tuning range is traversed.

Figures 4, 5, 6, 7, 8, 9:
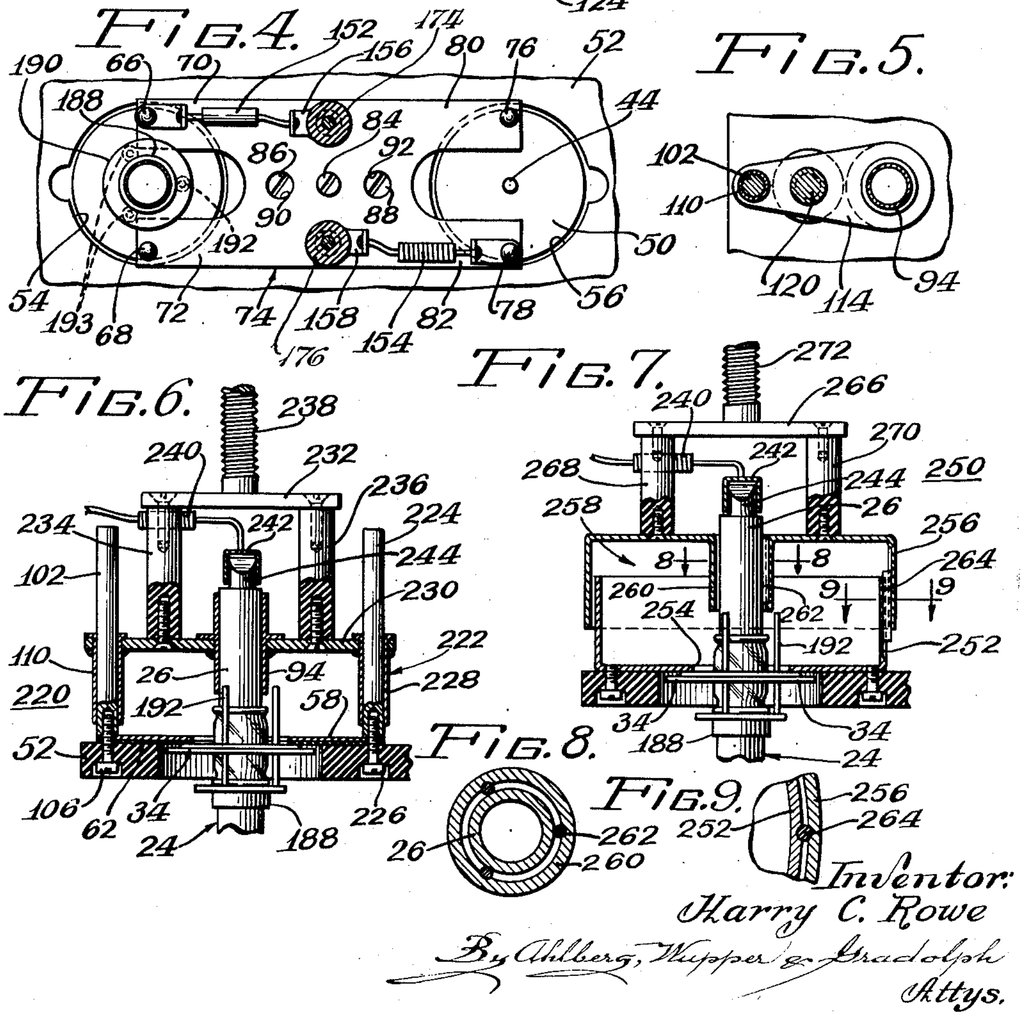
Fig. 4 is a fragmentary elevational sectional view taken as indicated by the line 4—4 of Fig. 2.
Fig. 5 is a fragmentary elevational sectional view taken as indicated by the line 5—5 in Fig. 2.
Fig. 6 is a fragmentary plan sectional view similar to Fig. 2 illustrating a modification of the tuner shown in Figs. 1 to 5.
Fig. 7 is a fragmentary plan sectional view similar to Fig. 2 illustrating another modification of the tuner shown in Figs. 1 to 5.
Fig. 8 is an enlarged fragmentary sectional view taken as indicated by the line 8—8 in Fig. 7.
Fig. 9 is an enlarged fragmentary sectional view taken as indicated by the line 9—9 in Fig. 7.

*Apparatus of Fig. 6*

The modification illustrated in Fig. 6 is quite similar to a portion of the apparatus of Figs. 1–5 and corresponding components have been given the same reference characters in the various figures. A modified oscillator section 220 is illustrated in Fig. 6. However, it should be understood that the modifications are also applicable to the mixer section of the tuner. The oscillator section 220 includes a tuned circuit 222 which is somewhat similar to the tuned circuit 98 except that an additional post 224 is provided. The post 224 is secured to the rear mounting plate 52 by means of a machine screw 226. The post 224 is thereby clamped into electrical contact with the coupling plate 58 at a point diametrically opposite from the post 102.

A sleeve 228 is slidable along the post 224. The sleeve 228 is connected with the sleeves 94 and 110 by means of a cross bar 230. Means is provided to move the cross bar 230 backward and forward for tuning the oscillator, the means including an insulating bar 232 connected with the cross bar 230 by a pair of insulating pillars 234 and 236. A drive screw 238 is secured to the center of the insulating bar 232. The drive screw 238 is aligned with the axis of the tube 24.

Plate supply voltage may be applied to the tube 24 through a high frequency choke coil 240 which is connected by means of a clip 242 to a generally cylindrical nose 244 protruding axially from the plate cylinder 26. The nose 244 is electrically connected with the plate cylinder 26.

The additional post 224, the sleeve 228, and the righthand portion of the cross bar 230 provide an additional turn in parallel with the turn provided by the post 102 and the sleeve 110. Thus the tuned circuit 222 has a smaller inductance than the tuned circuit 98 of Fig. 2, assuming that corresponding dimensions of the two tuned circuits are the same. The tuned circuit 222 has a somewhat higher Q (factor of merit) than the tuned circuit 98.

*Apparatus of Figs. 7–9*

A further modification is illustrated in Figs. 7–9. This modification is also quite similar to a portion of the apparatus of Figs. 1–5 and corresponding parts have been given the same reference characters. Fig. 7 illustrates a modified oscillator section 250. However, again it should be understood that the modifications are applicable to the mixer section of the tuner. The oscillator section 250 includes a cylindrical cup 252 which is secured to the rear mounting plate 52. The grid disc 34 of the tube 24 directly contacts the cup 252, the insulating sheet 62 being omitted in this embodiment. The cup 252 has an axial aperture 254 which clears the tube 24 and the conductors 192.

The cup 252 together with a telescoping cup 256 forms a tuned circuit 258. An axial sleeve 260 secured to the cup 256 is slidable along the plate cylinder 26 of the tube 24. However, the sleeve 260 is electrically insulated from the plate cylinder 26 by means of a plurality of spacer rods 262 interposed between the sleeve and the cylinder 26. The cup 256 is electrically insulated from the cup 252 by means of a plurality of spacer rods 264. Plate voltage is supplied to the plate cylinder 26 by means of the choke coil 240, as described in connection with Fig. 6.

An insulating bar 266 is secured to the cup 256 by means of insulating pillars 268 and 270. A drive screw 272 may be carried by the center of the bar 266 to provide means for varying the extent to which the cups 252 and 256 are telescoped.

The telescoping cups 252 and 256 provide a toroidal tuned circuit which is primarily inductive. The tuned circuit 258 is resonated by its own distributed capacitance and the internal capacitance between the anode and the grid of the tube 24. The tuned circuit 258 provides a feed-back path from the anode to the grid of the tube 24. The operating frequency of the oscillator section 250 is varied by changing the extent to which the cups are telescoped, the frequency increasing as the cups are moved together. During tuning the sleeve 260 slides along the anode terminal cylinder 26.

The capacitance between the closely spaced cups 252 and 256 obviates any need for electrical contact between them. Likewise the capacitance between the sleeve 260 and the anode cylinder 26 makes direct electrical contact unnecessary. The elimination of sliding electrical contacts avoids any possibility of noisy operation during variation of the tuned circuit 258. Since the cup 252 is completely insulated from the anode cylinder 26, there is no need for a separate grid blocking capacitor. The capacitance between the cups serve this purpose.

The toroidal inductor 258 formed by the telescoping cups 252 and 256 has an extremely high figure of merit or Q. The magnetic field produced by the tuned circuit 258 is largely confined to the space within the cups 252 and 256.

*Comparison of the various modifications of Figs. 1–9*

It will be recognized that the tuned circuit 258 of Fig. 7 represents an ultimate development of the tuned circuit 98 of Fig. 2. The coupling plate 58, the post 102, the sleeve 110, the cross-bar 114, and the sleeve 94 represent an elemental segment of a toroidal tuned circuit such as the tuned circuit 258 of Fig. 7. Fig. 6 represents an intermediate development having two elements of a toroidal tuned circuit.

All of the embodiments of Figs. 1 to 9 include tuned circuits which are variable by sliding a sleeve along an anode terminal cylinder of an electron tube, or along a terminal cylinder of some other circuit component for utilizing high frequency signals.

Figures 10, 11:
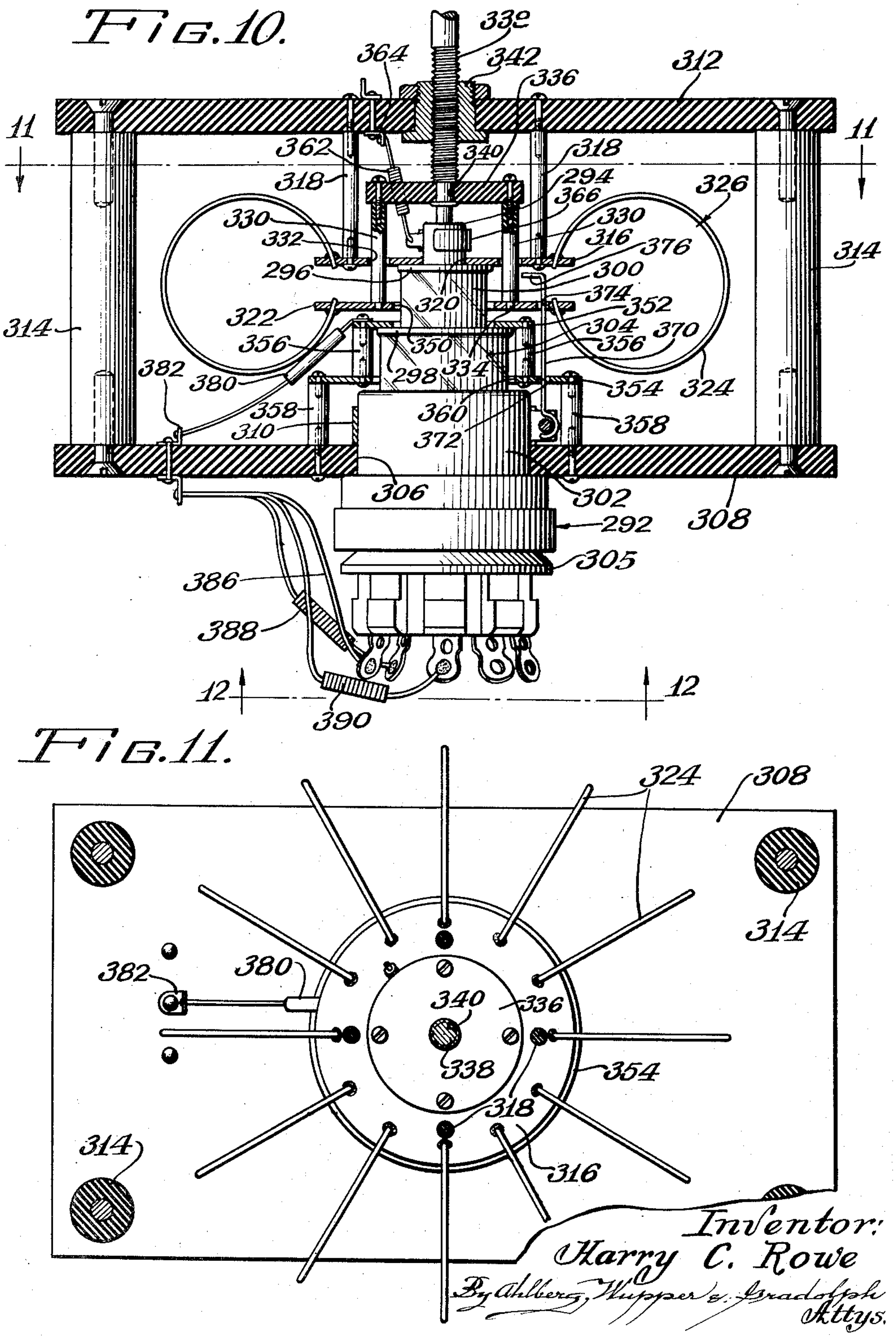
Fig. 10 is a sectional plan view of another improved modified tuner, constructed in accordance with the invention.
Fig. 11 is an elevational sectional view taken as indicated by the line 11 in Fig. 10.
Figure 12:
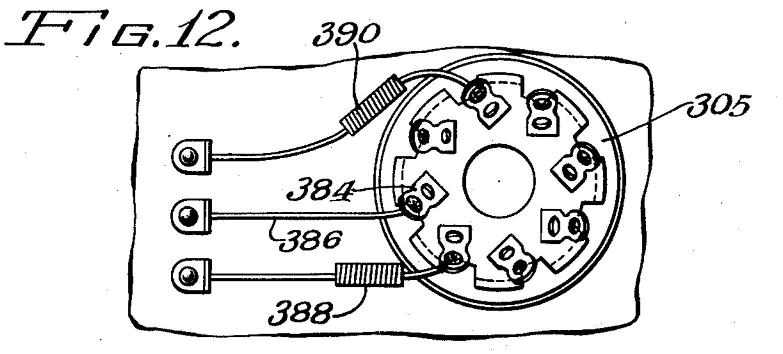
Fig. 12 is a fragmentary elevational view taken as indicated by the line 12—12 in Fig. 10.

*Apparatus of Figs. 10–12*

Figs. 10, 11 and 12 illustrate a modified oscillator section 290 of a tuner. Many of the constructional features illustrated in these figures are also applicable to a mixer section of a tuner.

The oscillator 290 of Fig. 10 includes a triode tube 292 having an anode terminal in the form of a cylindrical cap 294. A metallic disc 296 positioned behind the cap 294 is also connected to the anode of the tube 292. The grid terminal of the tube 292 is in the form of a disc 298 concentric with the disc 296 and spaced therefrom by a glass tubular section 300. The disc 298 has a larger diameter than the disc 296.

The tube 292 has a metallic shell 302 which is concentric with the disc 298 and is spaced therefrom by a tubular glass section 304. The shell 302 has a larger diameter than the disc 298. The shell 302 is coupled to the cathode of the tube 292 by capacitance inside the tube. Thus the shell 302 is a cathode terminal for high frequency currents. The cathode and heater connections to the tube 292 are brought out through base pins which may be contacted by means of a socket 305. The tube 292 may be a comercial type 2C40. Tube of this general configuration are usually known as lighthouse triodes.

The shell 302 of the tube 292 is positioned in an opening 306 in an insulating rear mounting plate 308. The tube 292 is secured to the plate 308 by means of a ring clamp 310.

An insulating front mounting plate 312 is connected with the rear mounting plate 308 by means of four insulating pillars 314. A metal disc 316 is secured to the front mounting plate 312 by means of a pair of insulating pillars 318. The anode terminal disc 296 electrically contacts the disc 316, and the anode terminal cap 294 extends through a central aperture 320 in the disc 316.

A metallic disc 322 is spaced behind the disc 316. The disc 322 is carried in this position by a plurality of wire loop 324 which have their ends soldered or welded to the peripheries of the discs 316 and 322. Twelve equally spaced radial wire loops 324 are illustrated. The loops together constitute an annular tuning inductor 326.

The tuning inductor is resonated primarily by the capacitance between the discs 316 and 322. The capacitance between the discs may be varied by changing the spacing between them. For this purpose four insulating rods 330 extend through clearance holes 332 in the disc 316. Projecting noses 334 at the rear ends of the rods 330 fit in corresponding apertures in the rear disc 322. Rearward thrust is applied to the rods 330 by means of an insulating disc 336 connecting the front ends of the rods. A metallic drive screw 338 is rotatably carried in a central aperture 340 in the disc 336. The drive screw is threaded through a metallic bushing 342 carried by the front plate 312. Thus the spacing between the plates 316 and 322 may be increased by advancing the drive screw 338. The wire loops 324 are conformed to urge the disc 322 toward the disc 316. Consequently the resiliency of the wire loops 324 moves the discs 322 and 316 together when the drive screw 338 is backed off.

The tubular glass section of the tube 292 extends through a clearance hole 350 in the disc 322. The disc 322 is spaced from a disc 352 which contacts the grid terminal disc 298. The disc 352 is mounted on an insulating disc 354 by means of insulating pillars 356.

The insulating disc 354 is connected with the rear mounting plate 308 by means of insulating pillars 358. The glass section 304 extends through a clearance opening 360 in the insulating disc 354. The insulating disc 354 is sufficiently flexible to provide for the maintenance of contact pressures between the discs 316 and the anode terminal disc 296 and also between the disc 352 and the grid terminal disc 298.

Anode voltage may be applied to the tube 292 by means of a high frequency choke coil 362 connected between a terminal lug 364 mounted on the front mounting plate 312 and a clip 366 mounted on the anode terminal cap 294.

Additional capacitance is provided between the anode and the cathode of the tube 292 by means of a conductor 370 which is secured to the ring clamp 310. The conductor 370 passes through a hole 372 in the insulating disk 354 and a clearance hole 374 in the insulating disc 322. The conductor 370 includes a front end portion 376 which is bent over to extend generally parallel with the disc 316. A plurality of conductors 370 may be provided for greater symmetry, if desired.

A grid biasing resistor 380 is connected between the disc 352 and a terminal lug 382 mounted on the rear mounting plate 308. The terminal lug 382 is connected to the cathode terminal 384 of the socket 305 by means of a conductor 386. Heater current may be supplied to the tube 292 by means of a pair of heater chokes 388 and 390 connected to the heater terminals of the socket 305.

The capacitance between the discs 322 and 352 provides coupling between the disc 322 and the grid terminal 298. The tuning inductance 326 is resonated by means of its own distributed capacitance and the capacitance between the grid and the anode of the tube 292, in addition to the capacitance between the discs 316 and 322.

The tuned circuit including the tuning inductance 326 provides feedback from the anode to the grid of the tube 292. The conductor 370 provides supplementary capacitance between the cathode and the anode of the tube 292 in order to improve the division of high frequency voltages between the anode to grid path and the grid to cathode path of the tube. Supplementary capacitance is usually desirable because the internal anode to cathode capacitance of the tube 292 is usually considerably lower than the internal grid to cathode capacitance.

The inductance of the tuning inductor 326 is relatively low because of the large number of wire loops 324 which make up the inductor 326. The Q of the inductor 326 is relatievly high. Because of the toroidal configuration of the inductor its magnetic field is largely concentrated within the wire loops 324.

Figure 13:
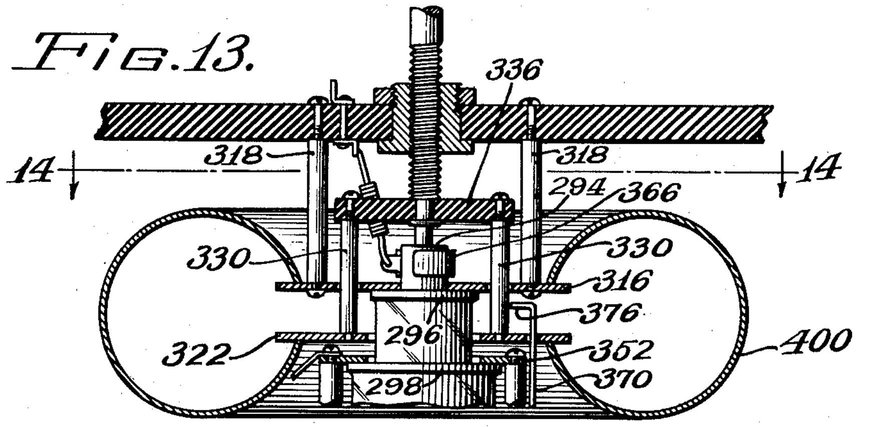
Fig. 13 is a sectional plan view similar to Fig. 10 illustrating a modification of the tuner of Fig. 10.
Figure 14:
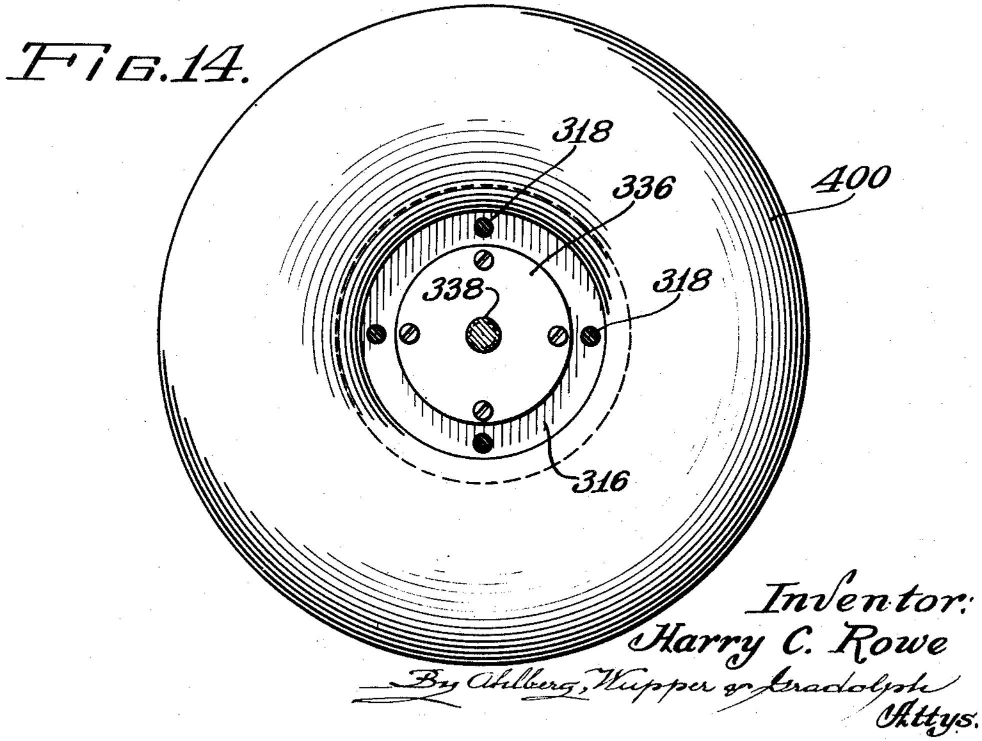
Fig. 14 is a fragmentary sectional view taken as indicated by the line 14—14 in Fig. 13.

*Apparatus of Figs. 13 and 14*

The modification of Figs. 13 and 14 is quite similar to the embodiment of Figs. 10 through 12, and corresponding parts have been given the same reference characters.

In the embodiment of Figs. 13 and 14, a tuning inductor 400 replaces the tuning inductor 326 of Fig. 10. The tuning inductor 400 is in the form of a single continuous sheet metal toroidal turn having its ends connected to the discs 316 and 322. The inductor 400 is conformed so that its resiliency urges the disc 322 toward the disc 316. In other respects the embodiments of Figs. 13 and 14 may be the same as the embodiment of Figs. 10 through 12.

The sheet metal toroidal tuning inductor 400 provides a somewhat lower inductance and a somewhat higher Q than the tuning inductor 326 of Figs. 10 and 11. Moreover, the magnetic field of the tuning inductor 400 is very largely confined within the inductor.

*Comparison of the various embodiments*

All of the embodiments include tuned circuits having toroidal inductive elements. The embodiments of Figs. 7 and 13 provide different forms of complete toroidal inductors. In the embodiment of Fig. 7 the resonant frequency of the tuned circuit is varied by changing the inductance of the toroidal coil. In the embodiment of Fig.

13 the resonant frequency is varied chiefly by changing the capacitance connected across the toroidal coil 400. The tuning inductance coils of the embodiments of Figs. 2, 6, and 10, include one or more elements of a complete toroidal coil.

Each of the embodiments includes an arrangement in which a tuned circuit is advantageously combined with an electron tube having coaxial terminals. The electron tube may be replaced by some other element, such as a crystal rectifier, for utilizing high frequency signals. Many of the embodiments illustrate how advantageously a toroidal tuning inductance may be combined with a signal utilizing element, such as a tube, having coaxial terminals.

All of the oscillators illustrated may readily be converted into amplifiers by coupling one end of the tuning inductance to the grid of the tube and the other end to the cathode. In the embodiments of Figs. 1 to 9 the conversion from an oscillator to an amplifier may readily be made merely by tuning the tube 24 end-for-end so that the cathode cylinder 28 rather than the anode cylinder 26 is positioned inside the tuning sleeve 94 or 260. The tube 24 is then operated as a grounded grid amplifier. Of course, appropriate power supply connections are made to the anode, the cathode and the grid.

Many of the details of the embodiments described above are merely illustrative and should not be taken as limitative. The invention may be practiced in many equivalent arrangements. The scope of the invention is indicated by the following claims.

I claim:

1. In an ultra high frequency tuner, a terminal cylinder, a coaxial terminal disc, a crystal rectifier positioned in the cylinder and having its opposite terminals connected to the cylinder and the disc, a coupling plate adjacent the disc, a dielectric film positioned between the plate and the disc, inductive tuning means including the cylinder and comprising in addition a cylindrical post connected to the plate and positioned externally parallel to and eccentrically offset from the cylinder, and a tuning slider including respective sleeves slidable on the post and on the cylinder and a cross bar connected between the sleeves.

2. In a high frequency oscillator, an electron tube having an anode terminal at one end, a cathode terminal at its other end, and a grid terminal between the anode and cathode terminals, a tuning inductance coupled between the grid terminal and the anode terminal, and a conductor directly connected to the cathode terminal and extending into the neighborhood of the anode terminal to provide supplementary capacitance between the cathode terminal and the anode terminal.

3. In a high frequency oscillator, an electron tube having an anode terminal at one of its ends, a cathode terminal at the other of its ends, and an intermediate grid terminal disc, a tuning inductance coupled between the grid terminal disc and the anode terminal, and a conductor directly connected to the cathode terminal and extending through the grid terminal disc and terminating open-ended in the neighborhood of the anode terminal to provide supplementary capacitance between the anode terminal and the cathode terminal, the grid disc having an opening clearing the conductor.

4. In a high frequency oscillator, an electron tube having an anode terminal cylinder at one end, a cathode terminal at its other end, and a grid disc therebetween, a sleeve slidably positioned on the anode cylinder, a tuning inductance including a post externally parallel to and laterally displaced from the anode cylinder and having one end coupled to the grid disc and its other end connected to the sleeve, and a conductor directly connected to the cathode terminal and extending through the grid disc into the neighborhood of the anode cylinder to provide supplementary capacitance between the anode cylinder and the cathode terminal, the grid disc having an aperture clearing the conductor.

5. In a high frequency tuner a mounting frame, a tuned circuit having a member which is movable to shift the resonant frequency of the circuit, a signal utilizing component having a terminal connected to the member, an insulating drive mounted to the mounting frame to move the member, a coil spring having one end engaging the member and the other engaging the mounting frame to take up any slack in the drive, and means contacting the other end of the coil spring to make an electrical connection to the terminal of the signal utilizing component.

6. In a high frequency tuner, a signal utilizing component having a terminal cylinder and a second terminal, a slider including a sleeve slidably carried on the terminal cylinder, an inductance element connected between the slider and the second terminal, a drive screw engaging the slider to shift the position of the sleeve on the terminal cylinder, a choke coil in the form of a coil spring having one end engaging the slider to take up any slack in the drive screw, and means connected to the opposite end of the coil spring to make an electrical connection for other than high frequency current to the terminal cylinder.

7. In a high frequency tuner, a tuning inductance including a movable tuning slider, a signal utilizing component having a terminal connected to the tuning inductance, an insulating drive screw engaging the slider, a choke coil in the form of a coil spring having one end engaging the tuning slider to take up any play in the drive screw, and means connected to the opposite end of the coil spring for making an electrical connection for other than high frequency current to the terminal of the signal utilizing component.

8. In a high frequency tuner, a tuning circuit including a variable inductance having a slider which is movable in a predetermined direction to decrease the resonant frequency of the tuning circuit, a signal utilizing component having a terminal connected to the variable inductance, an insulating drive engaging the slider, a fixed support positioned generally in the predetermined direction away from the slider, a choke coil in the form of a coil spring acting between the slider and the support for taking up any play in the drive, and means on the support connected to the coil spring to make an electrical connection for other than high frequency current with the terminal of the signal utilizing component, the inductance of the coil spring automatically increasing as the slider is moved to decrease the frequency of the tuning circuit, and vice versa.

9. In an ultra high frequency tuner, an electron tube having a cylindrical anode terminal and a grid terminal disc, a coupling plate directly adjacent the grid terminal, a dielectric film positioned between the grid disc and the coupling plate, a conductor connected to the coupling plate and positioned adjacent the cylindrical anode terminal, a tuning slider including connected contactors slidable on the conductor and on the anode terminal respectively, and means for manually adjusting the position of the slider.

10. In a unitary ultra high frequency tuner and mixer, a common frame including at least a base member and a support member, an electron tube and a crystal mixing rectifier each generally cylindrical in shape and each having a cylindrical coaxial terminal of substantially the same diameter, the electron tube having also a coaxial grid terminal plate, means for mounting said tube and said rectifier to said common frame in parallel relationship to each other, a condenser coupling to said grid terminal plate comprising a coupling plate positioned adjacent thereto and a dielectric film interposed between the grid terminal plate and the coupling plate, inductive tuning means for the tube and second inductive tuning means for the rectifier each including the respective cylindrical terminals of the tube and the rectifier and each including respective conductive posts mounted externally parallel to the respective terminal cylinders, the post included in the inductive tuning means for the tube being connected at its base to the coupling plate and the post included in the second inductive tuning means for the rectifier being connected at its base with the opposite terminal of the rectifier, each post being positioned at substantially the same distance from the cylindrical terminal of the tube or the rectifier with which each is respectively linked, two tuning sliders of substantially equal length, one electrically linking the cylindrical terminal of the tube to its associated post and the other linking the cylindrical terminal of the rectifier to its associated post and each being slidable upon the respective terminals and associated posts, and common drive means mounted to the frame for moving both sliders together and means for displacing one slider with respect to the other an adjustable, fixed, small distance in tuning direction whereby the tuning of the mixing rectifier is always at a frequency different by a fixed small frequency from that of the tuning of the tube.

References Cited in the file of this patent

UNITED STATES PATENTS

| | | |
|---|---|---|
| 2,209,626 | Larkin | July 30, 1940 |
| 2,223,835 | Smith | Dec. 3, 1940 |
| 2,233,763 | Ayer | Mar. 4, 1941 |
| 2,350,907 | Kroger | June 6, 1944 |
| 2,402,443 | Peterson | June 18, 1946 |
| 2,408,355 | Turner | Sept. 24, 1946 |
| 2,436,830 | Sharpless | Mar. 2, 1948 |
| 2,438,477 | Dodds | Mar. 23, 1948 |
| 2,505,572 | Overacker | Apr. 25, 1950 |
| 2,508,573 | Hulstede | May 23, 1950 |
| 2,579,511 | Ostlund | Dec. 25, 1951 |